United States Patent [19]

Keens et al.

[11] Patent Number: 5,022,863
[45] Date of Patent: Jun. 11, 1991

[54] APPARATUS FOR AN ELECTRICAL CONNECTION OF A PRINTED CIRCUIT BOARD TO A MODULE RAIL OF A COMPONENT RACK

[75] Inventors: Gary Keens, Plymouth; Roger Fursier, Cornwall, both of Great Britain

[73] Assignee: Rittal-Werk Loh GmbH & Co. KG, Fed. Rep. of Germany

[21] Appl. No.: 464,874

[22] Filed: Jan. 16, 1990

[30] Foreign Application Priority Data

May 26, 1989 [DE] Fed. Rep. of Germany ... 8906491[U]

[51] Int. Cl.$^5$ .............................................. H01R 4/66
[52] U.S. Cl. ...................................... 439/108; 439/65
[58] Field of Search ................... 361/399, 415; 439/61, 439/62, 64, 65, 108

[56] References Cited

U.S. PATENT DOCUMENTS 4,164,362 8/1979 Cobaugh et al. ..................... 439/64
4,381,878 5/1983 Lechner et al. .................. 439/64 X

FOREIGN PATENT DOCUMENTS 0025953 9/1980 European Pat. Off. .
3539404 5/1987 Fed. Rep. of Germany .
3716828 12/1988 Fed. Rep. of Germany .

Primary Examiner—Eugene F. Desmond
Attorney, Agent, or Firm—Thomas W. Speckman; Douglas H. Pauley

[57] ABSTRACT

An apparatus for an electric connection between a printed circuit board inserted into a receiving channel of a guide rail and a module rail carrying the guide rails of a component rack is disclosed. A sliding bow contact is aligned parallel to the inner walls of the first receiving channel of a guide rail into which the peripheral region of a printed circuit board in which region is located a ground conductor path is inserted. The sliding bow contact is secured to the guide rail. The sliding bow contact has at least one contact tip and at least one contact lug which are in electrical communication with the module rail and a divider strip insertable into a second receiving channel in the module rail.

2 Claims, 1 Drawing Sheet

APPARATUS FOR AN ELECTRICAL CONNECTION OF A PRINTED CIRCUIT BOARD TO A MODULE RAIL OF A COMPONENT RACK

BACKGROUND OF THE INVENTION

1. Field of the Invention

This invention relates to an electrical connection between a printed circuit board that is inserted into a receiving channel of a guide rail and a module rail carrying the guide rails of a component rack.

2. Description of the Prior Art

In a component rack, the metal module rails extend across the open front side where the printed circuit boards are inserted. The printed circuit boards are guided in two U-shaped guide rails, which form a receiving groove for the edge regions of the printed circuit board. Generally, these guide rails are constructed of plastic material. However, when using plastic material, problems arise in grounding the printed circuit board and electrically connecting it to the body of the component rack within the module rail.

SUMMARY OF THE INVENTION

It is one object of this invention to provide an electrical connection between a printed circuit board that is inserted into a receiving channel of a guide rail and a module rail carrying the guide rails of a component rack, which enables a simple, definite, electrical connection.

According to this invention, the objects are attained by having a printed circuit board in the peripheral region encompassed by a receiving channel that has a ground conductor track on at least one side. The receiving channel of the guide rail, in the region of fastening to the module rail, receives a sliding bow contact which is aligned parallel to the inner walls of the receiving channel and encompassingly receives the edge of the printed circuit board. Outside the receiving channel, the sliding bow contact is secured to the guide rail. The sliding bow contact extends out of the receiving channel and has formed contact springs, contact tips or contact lugs communicating electrically with the module rail and/or a divider strip for the guide rails that may be inserted into the module rail.

The sliding bow contact is secured to the guide rail and creates an electrical connection with the module rail and/or the divider strip inserted into the module rail when the guide rail is connected to the module rail. The sliding bow contact fits around the edge region of the inserted printed circuit board and establishes the electrical connection with the ground conductor track of the printed circuit board. This track is formed on at least one side in this peripheral region of the printed circuit board. This electrical connection can also be constructed to shield parts of the printed circuit board, if the ground conductor track is correspondingly wired on the printed circuit board.

In one embodiment of this invention, the sliding bow contact comprises a U-shaped bow part having two lateral legs which rest against the inner walls of the receiving channel and one contact spring formed onto each of the two lateral legs of the bow part. The contact springs, extending in the insertion direction of the printed circuit board, along the lateral legs of the guide rail, are resiliently embodied and braced against the facing opposed walls of the receiving channel of the guide rail. The contact springs do not impede the insertion of the printed circuit board into the guide rail, but if they are deflected upon insertion of the printed circuit board, in the direction toward the facing side walls of the receiving channel of the guide rail, they will form a suitable contact force.

According to one embodiment of this invention, the secured sliding bow contact with the guide rail and the electrical contact outside the receiving channel of the guide rail are attained by one lateral leg of the bow part of a guide rail into which the peripheral region of a printed circuit board in which region is located a ground conductor path is inserted merging with an initial segment of a Z-shaped connecting part. The middle segment of the connecting part is secured to a lateral extension of the guide rail. The end segment of the connecting part has contact springs, contact tips or contact lugs.

According to another embodiment of this invention, the connecting part rests with its initial segment on the outside of the overlapped lateral leg of the guide rail. The connecting part has an end segment that rests on the vertical outside of the lateral extension of the guide rail, and the sliding bow contact is seated on the guide rail.

According to yet another embodiment of this invention, a first connection option is attained if the end segment of the connecting part comes to an end directly in the contact lug, which is resiliently braced on the divider rail.

According to still another embodiment of this invention, to connect the sliding bow contact to the module rail, a contact spring overalapping one lateral leg of the guide rail and is resiliently braced on the module rail outside a receiving channel, which is open at the top, for receiving the divider strip. This contact spring being aligned parallel to the vertical outside of the lateral extension of the guide rail and extending in the insertion direction of the printed circuit board, has a laterally formed contact tip.

The invention will now be described in further detail in conjunction with the drawing.

DESCRIPTION OF THE PREFERRED EMBODIMENTS

Figure 1:
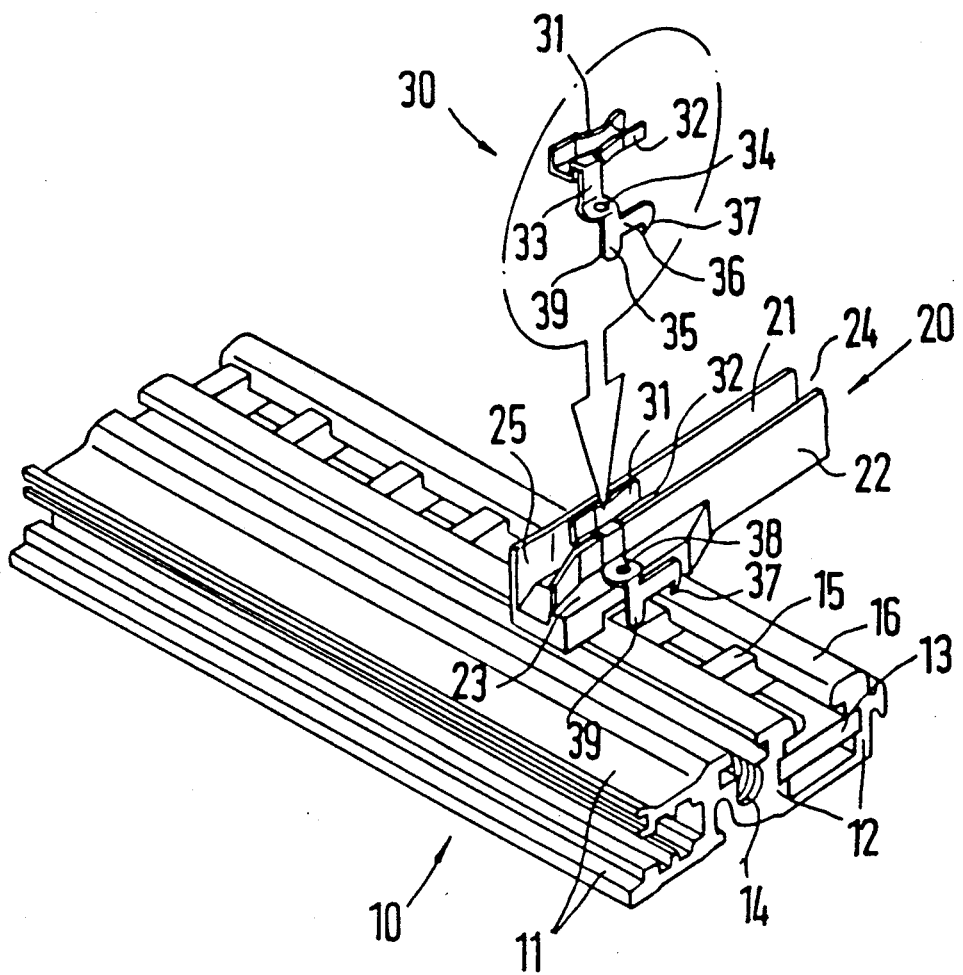
FIG. 1 shows a perspective view of the apparatus, according to this invention, in the vicinity of the module rail and shows an end of the guide rail oriented toward the module rail.

As shown in FIG. 1, a perspective view of module rail 10 extends across the front side of a component rack and is associated with the lower peripheral region of insertable printed circuit boards. Module rail 10 forms an open receiving channel 11 facing a front side. Module rail 10 has a receiving channel 12 that is open at the top. A strip with threaded holes, not shown, is inserted into receiving channel 11 and serves to connect the front panels of the printed circuit boards or printed circuit board inserts. Receiving channel 12 holds divider strip 13. Divider lugs 15 define the spacing for guide rails 20 that are connectable to module rail 10. Module rail 10 is constructed of metal and forms an electrical connection between the entire component rack and the control box or the like, which receives the component rack.

Lateral legs 21 and 22 of guide rail 20 form a U-shaped cross section. Lateral legs 21 and 22 form receiving channel 24 for the peripheral region of the printed circuit board. In the region of connection to module rail 10, guide rail 20 has sliding bow contact 30, which is shown in greater detail above guide rail 20. Sliding bow contact 30 has one bow part that follows and is supported by the inner walls of receiving channel 24. Bow contact 30 accepts the peripheral region of the inserted printed circuit board on both sides. Extending from the bow part are two contact springs, 31 and 32. Contact springs 31 and 32 are formed on lateral legs of bow contact 30 and extend toward the printed circuit board. Contact springs 31 and 32 are resilient. Contact springs 31 and 32 are braced with their free ends on the opposing inner walls of lateral legs 21 and 22 of guide rail 20, so that by the deflection of the middle portions of contact springs 31 and 32, sufficient contact force is attained upon insertion of the printed circuit board. Sliding bow contact 30 creates a definite electrical connection to the ground conductor track of the inserted printed circuit board. Module rail 10 has threaded bores 14 on a side end which enable easy connection to the lateral portions of the component rack.

Sliding bow contact 30 is secured to the fastening end of guide rail 20. The manner in which guide rail 20 is connected to module rail 10 is unimportant, a detent connection would suffice. A Z-shaped connecting part is formed onto the lateral leg of sliding bow contact 30 with contact spring 32 overlapping lateral leg 22 of guide rail 20. An initial segment 33 of the connecting part rests on the outside of lateral leg 22. The middle segment 34 of the connecting part is braced on lateral extension 23 of guide rail 20 and is secured to guide rail 20, as indicated by fastening region 38. End segment 35 of the connecting part rests on the vertical outside of lateral extension 23 and comes to an end directly within contact lug 39 which when voltage is applied is electrically conductive to divider lug 15 of divider strip 13. Contact spring 36 is also formed on end portion 3 of the connecting part. Contact spring 36 extends on the vertical outside of lateral extension 23 along the direction in which the printed circuit board is inserted, which is found toward the rear of the component rack. The power edge of contact spring 36 comes to an end at its free end in contact tip 37 which when voltage is applied is electrically conductive surface portion 16 of module rail 10. As a result of applying voltage, there is a highly conductive electrical connection of sliding bow contact 30 with both module rail 10 and divider strip 13, so that a continuous definite electrical connection exists between the ground conductor track of the printed circuit board and the component rack. Sliding bow contact 30 is secured to guide rail 20 and therefore, cannot be misplaced. According to this particular embodiment, it is possible to provide one guide rail 20, or both guide rails 20, of a printed circuit board with a sliding bow contact 30.

We claim:

1. In an apparatus for an electrical connection of a printed circuit board inserted into a first receiving channel of a guide rail to a module rail, the module rail carrying the guide rails of a component rack, the improvement comprising:

in a first peripheral region surrounded by the first receiving channel (24), a ground conductor path on at least one side of the printed circuit board;

in a second peripheral region of fastening to the module rail (10), the first receiving channel (24) of the guide rail (20) receiving a sliding bow contact (30), the sliding bow contact (30) being aligned parallel to inner walls of the first receiving channel (24) and the first receiving channel (24) receiving an edge of the printed circuit board;

outside the first receiving channel (24) the sliding bow contact (30) being secured to the guide rail (20), the sliding bow contact (30) being removable from the first receiving channel (24) and having at least one contact spring (36), at least one contact tip (37) and at least one contact lug (39) in electrical communication with at least one of the module rail (10) and a divider strip (13), and the divider strip being insertable into the module rail (10);

one of two lateral legs of a U-shaped bow part merging with an initial segment (33) of a Z-shaped connecting portion and overlapping one of guide rail lateral legs (21, 22), a middle segment (34) of said Z-shaped connecting portion being secured to a lateral extension (23) of said guide rail (20), and an end segment (35) of said Z-shaped connecting portion having at least one said contact spring (36), at least one said contact tip (37) and at least one said contact lug (39);

said initial segment (33) of said Z-shaped connecting portion being positioned adjacent an outside surface of said guide rail lateral leg (22) of said guide rail (20), and said end segment (35) of said Z-shaped connecting portion being positioned on a vertical outside surface of said lateral extension (23) of said guide rail (20);

said end segment (35) of said Z-shaped connecting portion terminating in said contact lug (39), said contact lug (39) being resiliently braced on said divider strip (13);

said contact spring (36) being positioned on said end segment (35) of said Z-shaped connecting portion, said contact spring (36) being aligned parallel to said vertical outside of said lateral extension (23) of said guide rail (20) and extending in an insertion direction of said printed circuit board; and said contact tip (37) being laterally formed on said contact spring (36), said contact tip (37) being resiliently braced on said module rail (10) outside a second receiving channel (12), said second receiving channel (12) being capable of receiving said divider strip (13).

2. An apparatus according to claim 1, wherein the sliding bow contact (30) further comprises said U-shaped bow part abutting against the inner walls of the first receiving channel (24), and at least one resiliently embodied contact spring (31,32) is formed onto each of two lateral legs of the U-shaped bow part, the resiliently embodied contact springs (31, 32) extending in an insertion direction of the printed circuit board along the guide rail lateral legs (21, 22) of the guide rail (20) and being braced against the inner walls of the first receiving channel (24) of the guide rail (20).

* * * * *